United States Patent
Breiling et al.

(10) Patent No.: US 9,399,228 B2
(45) Date of Patent: *Jul. 26, 2016

(54) METHOD AND APPARATUS FOR PURGING AND PLASMA SUPPRESSION IN A PROCESS CHAMBER

(71) Applicant: Novellus Systems, Inc., San Jose, CA (US)

(72) Inventors: Patrick Breiling, Portland, OR (US); Kevin Gerber, Portland, OR (US); Jennifer O'Loughlin, Portland, OR (US); Nagraj Shankar, Tualatin, OR (US); Pramod Subramonium, Beaverton, OR (US)

(73) Assignee: NOVELLUS SYSTEMS, INC., San Jose, CA (US)

( * ) Notice: Subject to any disclaimer, the term of this patent is extended or adjusted under 35 U.S.C. 154(b) by 256 days.

This patent is subject to a terminal disclaimer.

(21) Appl. No.: 13/760,686

(22) Filed: Feb. 6, 2013

(65) Prior Publication Data

US 2014/0217193 A1    Aug. 7, 2014

(51) Int. Cl.
*B05B 1/00* (2006.01)
*C23C 16/44* (2006.01)
*C23C 16/455* (2006.01)
*C30B 25/14* (2006.01)
*B05B 7/22* (2006.01)
*H01J 37/32* (2006.01)
(Continued)

(52) U.S. Cl.
CPC . *B05B 1/005* (2013.01); *B05B 7/22* (2013.01); *C23C 16/4412* (2013.01); *C23C 16/455* (2013.01); *C23C 16/45536* (2013.01); *C23C 16/45561* (2013.01); *C23C 16/45565* (2013.01); *C23C 16/45591* (2013.01); *C23C 16/50* (2013.01); *C30B 25/14* (2013.01); *H01J 37/3244* (2013.01); *H01J 37/32633* (2013.01); *B05B 1/18* (2013.01); *Y10T 29/49826* (2015.01)

(58) Field of Classification Search
CPC .............. C23C 16/4412; C23C 16/455; C23C 16/45565; C23C 16/45561; C30B 25/14
USPC ...................................... 118/715; 156/345.33
See application file for complete search history.

(56) References Cited

U.S. PATENT DOCUMENTS

| | | | | |
|---|---|---|---|---|
| 4,961,399 A | * | 10/1990 | Frijlink | C30B 25/14 118/715 |
| 4,989,541 A | * | 2/1991 | Mikoshiba | C23C 16/45517 118/715 |
| 5,399,254 A | | 3/1995 | Geisler et al. | |

(Continued)

OTHER PUBLICATIONS

Terry Day. "The Coanda Effect and Lift. Copyright 2008." pp. 1-017. Source location: http://www.vortexu dynamics.com.au/lift.html. Available: http://www.newfluidtechnology.com.au/wpcontent/uploads/THE_COANDA_EFFECT_AND_LIFT.pdf. Accessed: Dec. 12, 2014.

(Continued)

*Primary Examiner* — Rudy Zervigon

(57) ABSTRACT

A substrate processing system includes a showerhead that comprises a head portion and a stem portion and that delivers precursor gas to a processing chamber. A baffle includes a base portion having an outer diameter that is greater than an outer diameter of the head portion of the showerhead, that comprises a dielectric material and that is arranged between the head portion of the showerhead and an upper surface of the processing chamber.

8 Claims, 4 Drawing Sheets

(51) Int. Cl.
*C23C 16/50* (2006.01)
*B05B 1/18* (2006.01)

(56) References Cited

U.S. PATENT DOCUMENTS

| | | | |
|---|---|---|---|
| 5,453,124 A * | 9/1995 | Moslehi | C23C 16/45561 118/715 |
| 5,532,190 A * | 7/1996 | Goodyear | C23C 16/45512 118/715 |
| 5,580,387 A | 12/1996 | Chen | |
| 5,954,881 A | 9/1999 | Burk, Jr. et al. | |
| 6,059,885 A * | 5/2000 | Ohashi | C23C 16/4401 118/715 |
| 6,132,512 A * | 10/2000 | Horie | C23C 16/45565 118/715 |
| 6,149,727 A | 11/2000 | Yoshioka et al. | |
| 6,183,563 B1 | 2/2001 | Choi et al. | |
| 6,285,010 B1 | 9/2001 | Fujikawa et al. | |
| 6,289,842 B1 | 9/2001 | Tompa | |
| 6,302,965 B1 * | 10/2001 | Umotoy | C23C 16/16 118/715 |
| 6,387,182 B1 * | 5/2002 | Horie | C23C 16/409 118/244 |
| 6,444,039 B1 * | 9/2002 | Nguyen | C23C 16/455 118/715 |
| 6,478,872 B1 * | 11/2002 | Chae | C23C 16/45548 117/105 |
| 6,495,233 B1 * | 12/2002 | Shmurun | C23C 16/455 118/713 |
| 6,499,425 B1 * | 12/2002 | Sandhu | C23C 16/34 118/723 E |
| 6,830,624 B2 * | 12/2004 | Janakiraman | C23C 16/4405 118/715 |
| 6,849,241 B2 | 2/2005 | Dauelsberg et al. | |
| 6,899,764 B2 * | 5/2005 | Frijlink | C23C 16/4412 118/715 |
| 6,998,014 B2 * | 2/2006 | Chen | C23C 16/06 118/723 E |
| 7,017,514 B1 * | 3/2006 | Shepherd, Jr. | C23C 16/452 118/723 ME |
| 7,572,337 B2 * | 8/2009 | Rocha-Alvarez | C23C 16/4405 118/715 |
| 7,622,005 B2 * | 11/2009 | Balasubramanian | C23C 16/4405 118/715 |
| 7,758,698 B2 * | 7/2010 | Bang | C23C 16/4405 118/715 |
| 8,092,598 B2 * | 1/2012 | Baek | C23C 16/4412 118/715 |
| 8,100,081 B1 * | 1/2012 | Henri | C23F 4/00 118/723 ER |
| 8,152,924 B2 * | 4/2012 | Dauelsberg | C23C 16/45508 118/715 |
| 8,197,636 B2 * | 6/2012 | Shah | H01J 37/32366 118/719 |
| 8,715,455 B2 * | 5/2014 | Brcka | H01J 37/32357 118/715 |
| 8,882,913 B2 * | 11/2014 | Byun | C23C 16/40 118/715 |
| 8,968,512 B2 * | 3/2015 | Nishimoto | 118/666 |
| 2002/0039625 A1 * | 4/2002 | Powell | C23C 16/452 427/569 |
| 2003/0054099 A1 | 3/2003 | Jurgensen et al. | |
| 2003/0070620 A1 | 4/2003 | Cooperberg et al. | |
| 2003/0075273 A1 | 4/2003 | Kilpela et al. | |
| 2003/0077388 A1 | 4/2003 | Byun | |
| 2004/0011286 A1 * | 1/2004 | Kwon | C23C 16/481 118/715 |
| 2004/0168769 A1 | 9/2004 | Matsuoka et al. | |
| 2004/0216844 A1 * | 11/2004 | Janakiraman | C23C 16/4405 156/345.33 |
| 2005/0263072 A1 * | 12/2005 | Balasubramanian | C23C 16/4405 118/715 |
| 2005/0263248 A1 * | 12/2005 | Rocha-Alvarez | C23C 16/4405 156/345.34 |
| 2005/0263484 A1 | 12/2005 | Park et al. | |
| 2006/0090705 A1 | 5/2006 | Kim | |
| 2006/0130756 A1 * | 6/2006 | Liang | C23C 16/45563 118/715 |
| 2006/0196420 A1 * | 9/2006 | Ushakov | C23C 16/45563 118/715 |
| 2006/0196603 A1 * | 9/2006 | Lei | H01J 37/32082 156/345.33 |
| 2006/0263522 A1 | 11/2006 | Byun | |
| 2007/0293043 A1 | 12/2007 | Singh et al. | |
| 2008/0121177 A1 * | 5/2008 | Bang | C23C 16/4405 118/723 I |
| 2008/0121179 A1 * | 5/2008 | Park | C23C 16/4405 118/723 R |
| 2008/0124944 A1 * | 5/2008 | Park | C23C 16/4401 438/778 |
| 2008/0185104 A1 * | 8/2008 | Brcka | H01J 37/32357 156/345.29 |
| 2008/0185284 A1 * | 8/2008 | Chen | H01J 37/321 204/164 |
| 2008/0188087 A1 * | 8/2008 | Chen | C23C 16/507 438/758 |
| 2008/0241384 A1 * | 10/2008 | Jeong | C23C 16/45504 427/255.29 |
| 2008/0308040 A1 * | 12/2008 | Dauelsberg | C23C 16/45508 118/715 |
| 2009/0056629 A1 * | 3/2009 | Katz | H01J 37/3244 118/723 R |
| 2009/0095219 A1 | 4/2009 | Meinhold et al. | |
| 2009/0095220 A1 | 4/2009 | Meinhold et al. | |
| 2009/0159424 A1 | 6/2009 | Liu et al. | |
| 2010/0048028 A1 * | 2/2010 | Rasheed | C23C 16/4404 438/758 |
| 2010/0055342 A1 | 3/2010 | Chiang et al. | |
| 2010/0288728 A1 | 11/2010 | Han et al. | |
| 2011/0198417 A1 | 8/2011 | Detmar et al. | |
| 2011/0253044 A1 | 10/2011 | Tam et al. | |
| 2013/0092086 A1 * | 4/2013 | Keil | H01J 37/3255 118/723 E |
| 2013/0344245 A1 * | 12/2013 | Xia | C23C 16/4401 427/255.7 |
| 2014/0072726 A1 * | 3/2014 | Kim | C23C 16/50 427/569 |
| 2014/0217193 A1 * | 8/2014 | Breiling | B05B 1/005 239/1 |
| 2015/0167168 A1 * | 6/2015 | Keshavamurthy | C23C 16/45565 438/758 |

OTHER PUBLICATIONS

Search Report and Written Opinion corresponding to Singapore Application No. 201304839-2 dated Nov. 4, 2014, 12 pages.

* cited by examiner

METHOD AND APPARATUS FOR PURGING AND PLASMA SUPPRESSION IN A PROCESS CHAMBER

FIELD

The present disclosure relates to substrate processing systems and more specifically to purging and plasma suppression in a substrate processing system.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems such as plasma-enhanced atomic layer deposition (PEALD) and plasma-enhanced chemical vapor deposition (PECVD) may be used to deposit and etch films on substrates such as semiconductor wafers. Some PEALD and PECVD systems include chandelier-type showerheads that supply precursors to a processing chamber.

The showerheads typically include a stem portion that extends into the processing chamber and a head portion connected to the stem portion. A cavity is formed behind the head portion between the head portion and an upper surface of the processing chamber. Parasitic plasma in the volume may cause unwanted deposition to occur in the volume.

There are two approaches for addressing problems associated with the volume behind the showerhead. In one approach, the volume is purged to prevent process gases from getting behind the showerhead and causing unwanted deposition. However, purging behind the showerhead does not isolate the volume. The lack of volume isolation increases the required flow rates to purge the required volume. Purging also requires high purge gas flow and some purge gas flow directionality. The higher purge gas flow tends to adversely impact process conditions by mixing with process gases and/or shifting the plasma impedance, which may cause light up behind the showerhead.

In another approach, apparatus is used to suppress the plasma in the volume to prevent unwanted deposition behind the showerhead. Plasma suppression creates a barrier over the showerhead and reduces parasitic plasma in unwanted areas of the tool.

SUMMARY

A substrate processing system includes a showerhead that comprises a head portion and a stem portion and that delivers precursor gas to a processing chamber. A baffle includes a base portion having an outer diameter that is greater than an outer diameter of the head portion of the showerhead. The baffle comprises a dielectric material and is arranged between the head portion of the showerhead and an upper surface of the processing chamber.

In other features, a collar connects the showerhead to the upper surface of the processing chamber. The baffle includes a stem portion extending from the base portion towards the upper surface of the processing chamber. The stem portion of the baffle is arranged around the stem portion of the collar.

In other features, the stem portion of the baffle extends beyond the upper surface of the processing chamber. One or more purge gas inlets supply purge gas to a volume defined between the baffle and the upper surface of the processing chamber. Flow of purge gas through a gap between a radially outer surface of the showerhead and a side wall of the processing chamber is varied based on a thickness of the baffle and a width of the gap of the baffle to provide a predetermined Peclet number. The showerhead cannot simply be extended to the adjacent chamber wall. The gap between the showerhead and wall prevents arcing between the two components when the showerhead is excited by electrical change or RF power.

In other features, a purge gas flow rate, the width of the gap of the baffle and the thickness of the baffle are selected to provide a Peclet number greater than or equal to 5. In some examples, the dielectric material is selected from a group consisting of quartz, sapphire, alumina, and aluminum nitride. In some examples, the width of the gap of the baffle is less than or equal to 0.2 inches and the thickness of the baffle is less or equal to than 1 inch, although gaps less than 0.2 inches or greater than 1 inch can be used. The flow rate would need to be increased in both cases (gaps less than 0.2 inches or greater than 1 inch) to maintain the peclet number greater than or equal to 5, or the peclet number can be decreased. As can be appreciated, the peclet number may be varied depending on the application.

In other examples, the thickness of the dielectric baffle may be much thicker and can partially or completely fill the volume between a top surface of the showerhead and the top surface of the processing chamber.

A method for operating a substrate processing system includes connecting a showerhead to an upper surface of a processing chamber. The showerhead includes a head portion and a stem portion. The method includes arranging a baffle between the head portion of the showerhead and an upper surface of the processing chamber. An outer diameter of the base portion of the baffle is greater than an outer diameter of the head portion of the showerhead. The baffle comprises a dielectric material.

In other features, a collar is used to connect the showerhead to the upper surface of the processing chamber. The baffle includes a stem portion extending from the base portion towards the upper surface of the processing chamber. The stem portion of the baffle is arranged around the stem portion of the collar.

In other features, the stem portion of the baffle extends beyond the upper surface of the processing chamber.

In other features, the method includes supplying purge gas using one or more purge gas inlets to a volume defined between the baffle and the upper surface of the processing chamber.

In other features, the method includes selecting a flow rate of purge gas through a gap between a radially outer surface of the showerhead and a side wall of the processing chamber based on a thickness of the baffle and a width of the gap of the baffle.

In other features, the method includes selecting the width of the gap of the baffle and the thickness of the baffle to provide a Peclet number greater than or equal to 5. The method includes selecting the dielectric material from a group consisting of quartz, sapphire, alumina, and aluminum nitride. The method includes selecting the width of the gap of the baffle that is less than or equal to 0.2 inches and the thickness of the baffle that is less than or equal to 1 inch.

Further areas of applicability of the present disclosure will become apparent from the detailed description provided hereinafter. It should be understood that the detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

DETAILED DESCRIPTION

Figure 1:
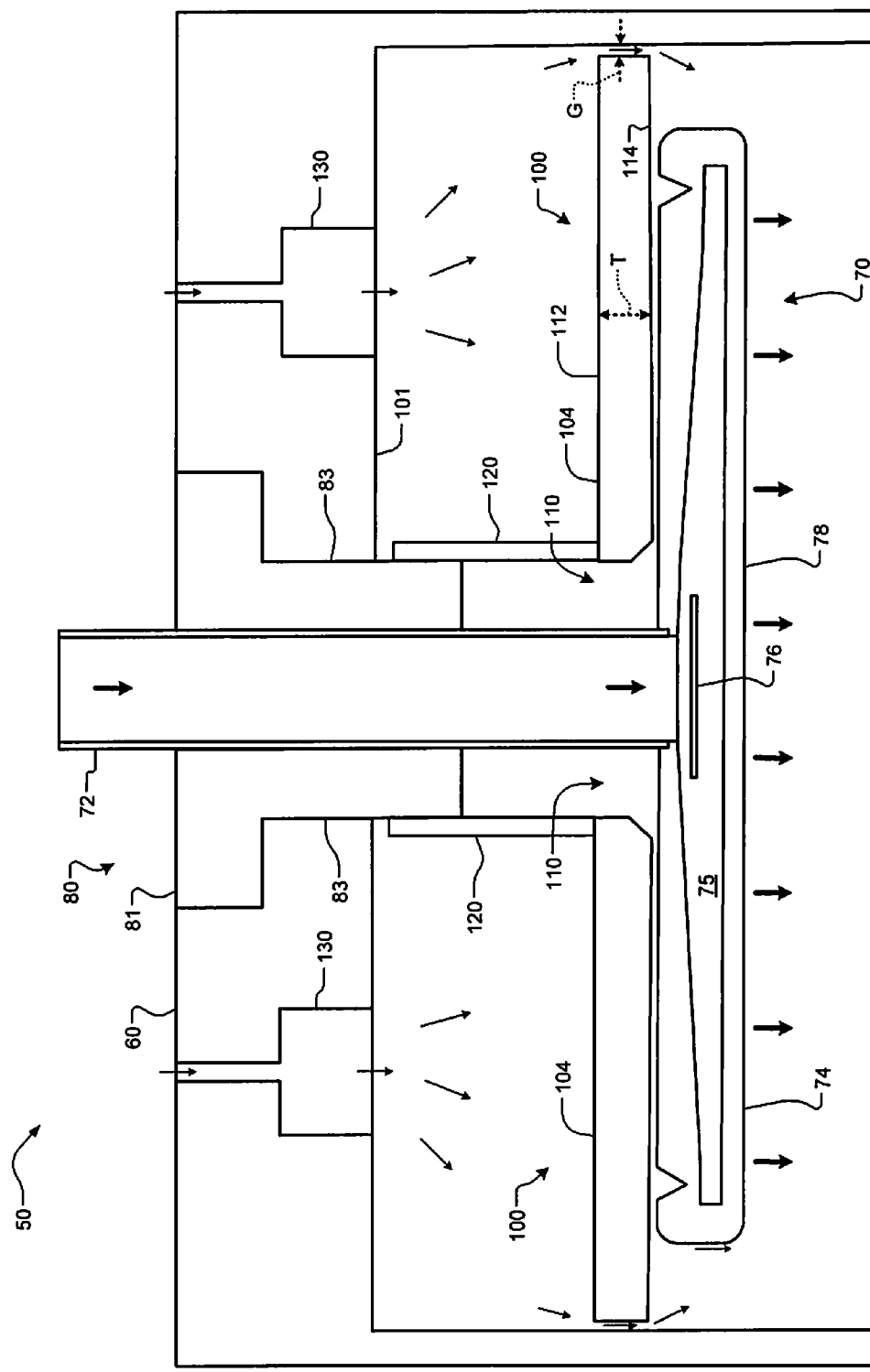
FIG. 1 is a cross-sectional view of an example of a processing chamber with a showerhead and a secondary purge flow path according to the present disclosure.
Figure 2:
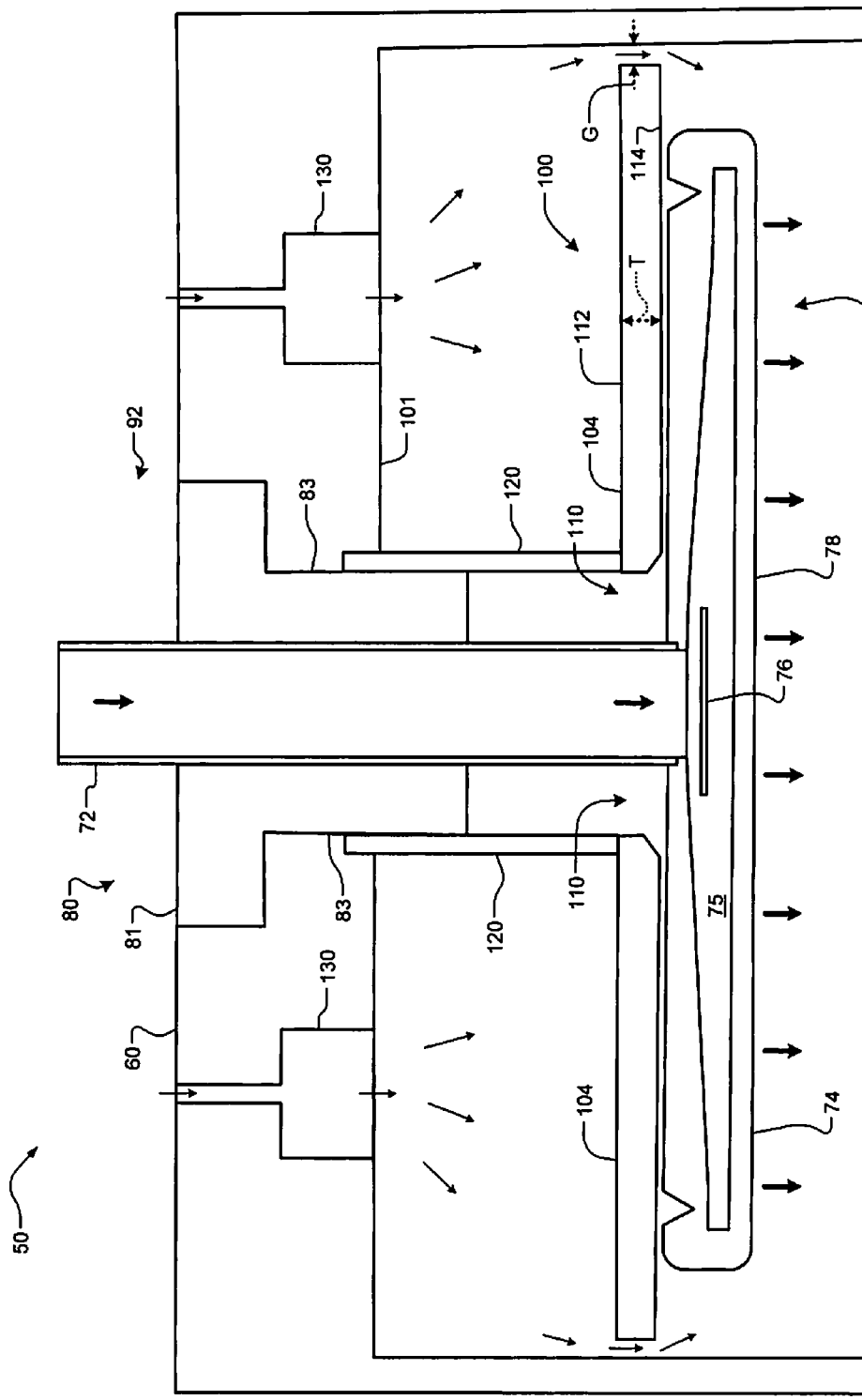
FIG. 2 is a cross-sectional view of an example of a processing chamber with a showerhead and a secondary purge flow path according to the present disclosure.

Referring now to FIGS. 1 and 2, examples of a substrate processing system 50 including a processing chamber 60 with a showerhead 70 is shown. In FIG. 1, the showerhead 70 includes a stem portion 72 and a head portion 74. The head portion 74 defines an inner cavity 75 of the showerhead 70. Fluids such as precursors or purge gas flow through the stem portion 72, onto a dispersion plate 76 and into the inner cavity 75. The fluids then pass through spaced holes 78 in a bottom surface of the head portion 74 and into the processing chamber 60. The stem portion 72 of the showerhead 70 is connected to a top wall of the processing chamber 60 by a collar 80. In some examples, the collar 80 has a generally "T"-shaped cross section and includes a head portion 81 and a stem portion 83.

A dielectric baffle 100 is arranged between the head portion 74 of the showerhead 70 and a top surface or plate 101 of the processing chamber. The dielectric baffle 100 includes a base portion 104 with a central opening or bore 110, a top surface 112 and a bottom surface 114. The base portion 104 may have an annular shape. As can be appreciated, the central opening or bore 110 created by the dielectric baffle 100 is not required. In other words, in some examples, the collar 80 can integrated with the baffle and/or the central opening or bore 110 can be eliminated.

A purge flow rate, a baffle gap G and thickness T of the dielectric baffle 100 may be selected to adjust a Peclet number to a predetermined Peclet number. In some examples, an outer diameter of the dielectric baffle is greater than a diameter of the showerhead. In other words, the baffle gap G is less than a gap between a radially outer edge of the showerhead 70 and a side wall of the processing chamber 60.

The dielectric baffle 100 may also include a stem portion 120. The stem portion 120 may have a cylindrical shape. The dielectric baffle 100 may extend from a radially inner portion of the dielectric baffle 100 into an abutting relationship with an outer surface of the stem portion 83 of the collar 80. One or more purge gas inlets 130 may be used to supply purge gas into the volume defined between the dielectric baffle 100 and the upper surface 101 of the processing chamber 60.

The dielectric baffle 100 in FIG. 1 extends partially but not fully towards the upper surface 101 of the process chamber 60. In contrast, the dielectric baffle 100 in FIG. 2 extends beyond the upper surface 101 of the processing chamber 60.

The geometry of the dielectric baffle 100 performs two functions. The dielectric baffle 100 acts as a gas plenum. In other words, the dielectric baffle 100 forms an inert gas purged plenum above the showerhead 70 for the purpose of purging the volume and creating a manifold to guide output purge gas flow into remaining portions of the processing chamber 60.

The dielectric baffle 100 also performs radio frequency (RF) plasma suppression. In other words, the material and the geometry of the dielectric baffle 100 are designed to form a dielectric barrier on the top of the showerhead 70. The dielectric baffle 100 may also include heat transfer management properties, and have the combined effect of shaping the plasma field created between the showerhead 70 and a pedestal (not shown) in the processing chamber 60.

The dielectric baffle 100 is installed above the showerhead 70 and overlaps the collar 80. The geometry of the dielectric baffle 100 extends towards a side wall of the processing chamber 60 to physically isolate a chamber volume above the showerhead 70.

The dielectric baffle 100 may be made of dielectric materials having different compositions to control various functions. The material may have a reduced metal composition such as oxides of metals. Using this type of material reduces possible metal contamination of a substrate such as a semiconductor wafer. Certain metal oxides may interact with precursors used for deposition, and their use may be reduced. The dielectric material may also be selected based on thermal conduction properties in order to either increase or decrease conduction of the dielectric baffle 100. In some examples, the dielectric baffle 100 is made of quartz, although other dielectric materials may be used. For example only, depending on the process chemistry, materials such as sapphire, alumina, or aluminum nitride may be used. Still other dielectric materials may be used.

The dielectric baffle 100 operates as a gas distribution manifold to guide the gas flow out of the volume. The gas distribution manifold defined by the dielectric baffle 100 is designed to reduce or optimize the purge gas flow used to purge the volume, reducing diffusion, above the showerhead. The gas distribution manifold defined by the dielectric baffle 100 guides the exiting gases to specific areas of the processing chamber 60. The gases may be guided to an inner diameter (ID) of the processing chamber 60 to act as an air curtain and to create a virtual concentric volume around the showerhead 70 and the pedestal. The air curtain at the ID of the processing chamber 60 also reduces diffusion of precursors to the walls of the processing chamber 60 to reduce or prevent unwanted deposition. The gas distribution manifold defined by the dielectric baffle may also move the gas flow closer to the showerhead outer diameter (OD) to enhance the reduction of diffusion.

The gas manifold may also have radially non-uniform flow in order to create an effectively uniform 'curtain' around the showerhead and pedestal. The non-uniformity is driven by non-uniform features in the chamber such as viewports and chamber throat, but it is not limited to these.

In addition, the dielectric baffle according to the present disclosure suppresses plasma and allows the purge gas flow to be lower than conventional purge gas plasma suppression described above, which reduces the adverse impact on process conditions.

Figure 3:
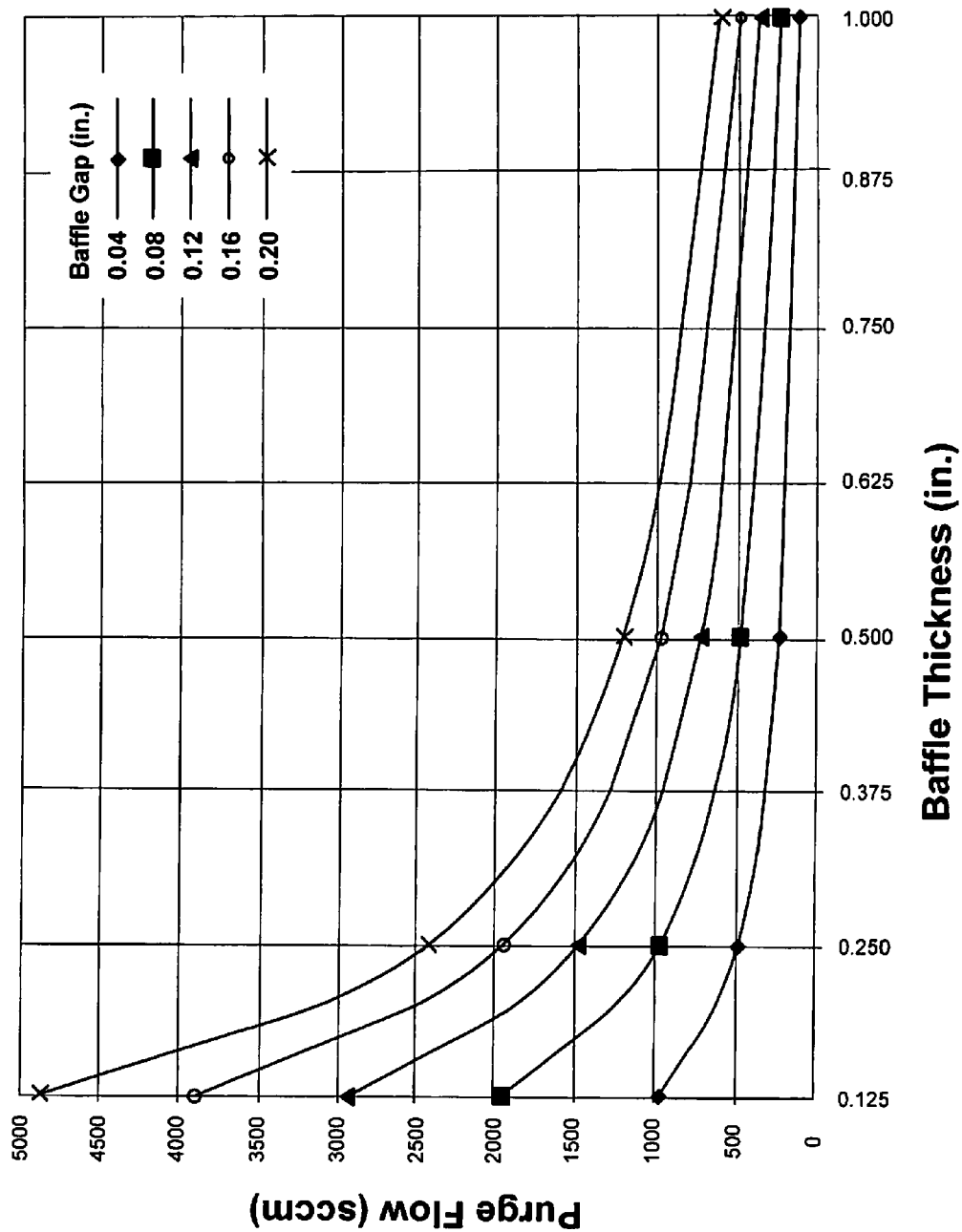
FIG. 3 is a graph illustrating variations in purge flow to provide a predetermined Peclet number as a function of baffle thickness and baffle gap.

FIG. 3 shows a modeling example demonstrating anticipated effects on the precursor concentration. The modeling shows the purge gas flow rates for the dielectric baffle with different baffle gaps and baffle thicknesses to provide a Peclet number of 5. In some examples, the dielectric baffle provides a Peclet number of >5 to reduce unwanted deposition of the precursor. In the modeling, the following formula was used:

$$P_e = \frac{v \cdot d}{D_{ab}}$$

Where $P_e$ is the Peclet number, v refers to a gas velocity through the opening through which diffusion is being controlled (adjusted for temperature and pressure of the process), d is a distance over the opening/area which back diffusion is to be controlled (in this case, the thickness of the flat portion of the baffle), and $D_{ab}$ is the diffusion coefficient between the two gasses used for the process.

The processing chamber 60 with the dielectric 100 baffle allows increased deposition rates and improved thickness ranges as compared to operation without the dielectric baffle 100. The dielectric baffle 100 also enables lower purge flow and reduces parasitic plasma above the showerhead 70 while reducing the unwanted deposition.

Use of the dielectric baffle 100 reduces maintenance time and frequency for the processing chamber 60. Use of the dielectric baffle 100 also reduces the risk of particle contamination of the substrate.

While dielectric baffle 100 according to the present disclosure is disclosed in conjunction with PECVD and PEALD processes, the dielectric baffle 100 may be used in other processes using the showerhead 70. For example only, the dielectric baffle 100 may be used in processes for creating conformal films.

In some examples, transitional impact effects may also be minimized by flowing the purge gas constantly, or starting flow of the purge gas prior (a few seconds) to process chemistry flowing.

Figure 4:
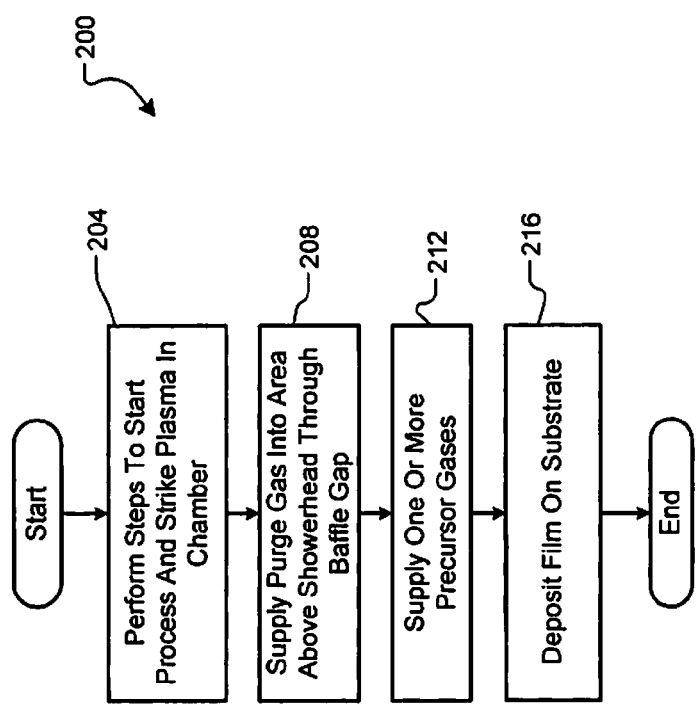
FIG. 4 is a flowchart illustrating an example of a method according to the present disclosure.

FIG. 4 shows an example of a method 200 using the dielectric baffle according to the present disclosure. At 204, steps are performed to start a process and to strike plasma in the processing chamber 60. At 208, flow of purge gas is initiated in the processing chamber 60. While the purge gas is initiated prior to the one or more precursor gases in this example, flow of the purge gas may be initiated before or after initiating flow of the one or more precursor gases. At 212, flow of one or more precursor gases is initiated. At 216, film is deposited on the substrate.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. For purposes of clarity, the same reference numbers will be used in the drawings to identify similar elements. As used herein, the phrase at least one of A, B, and C should be construed to mean a logical (A or B or C), using a non-exclusive logical OR. It should be understood that one or more steps within a method may be executed in different order (or concurrently) without altering the principles of the present disclosure.

What is claimed is:

1. A substrate processing system, comprising:
   a showerhead that comprises a head portion and a stem portion and that delivers precursor gas to a processing chamber;
   a baffle that includes a base portion having an outer diameter that is greater than an outer diameter of the head portion of the showerhead,
   wherein the baffle comprises a dielectric material and is arranged (i) above the head portion of the showerhead, (ii) between the head portion of the showerhead and an upper surface of the processing chamber,
   wherein the baffle defines (i) a volume between the baffle and the upper surface of the processing chamber and (ii) a gap between an outer edge of the baffle and sidewalls of the processing chamber,
   wherein the gap between the outer edge of the baffle and the sidewalls of the processing chamber is smaller than a gap between an outer edge of the showerhead and the sidewalls of the processing chamber,
   wherein the gap between the outer edge of the baffle and the sidewalls of the processing chamber extends from the outer edge of the baffle to the sidewalls, and wherein no structure is arranged in the gap between the outer edge of the baffle and the sidewalls of the processing chamber, and
   wherein no structure is arranged in the gap between the outer edge of the showerhead and the sidewalls of the processing chamber; and
   one or more purge gas inlets arranged in the upper surface of the processing chamber to supply purge gas downward into the volume defined between the baffle and the upper surface of the processing chamber.

2. A substrate processing system, comprising:
   a showerhead that comprises a head portion and a stem portion and that delivers precursor gas to a processing chamber;
   a baffle that includes a base portion having an outer diameter that is greater than an outer diameter of the head portion of the showerhead,
   wherein the baffle comprises a dielectric material and is arranged (i) above the head portion of the showerhead, (ii) between the head portion of the showerhead and an upper surface of the processing chamber,
   wherein the baffle defines (i) a volume between the baffle and the upper surface of the processing chamber and (ii) a gap between an outer edge of the baffle and sidewalls of the processing chamber,
   wherein the gap between the outer edge of the baffle and the sidewalls of the processing chamber is smaller than a gap between an outer edge of the showerhead and the sidewalls of the processing chamber,
   wherein the qap between the outer edqe of the baffle and the sidewalls of the processing chamber extends from the outer edge of the baffle to the sidewalls, and wherein no structure is arranqed in the qap between the outer edqe of the baffle and the sidewalls of the processing chamber, and
   wherein no structure is arranged in the qap between the outer edge of the showerhead and the sidewalls of the processing chamber; and
   a collar that connects the showerhead to a upper surface of the processing chamber, wherein the collar includes a head portion and a stem portion, wherein:
   the baffle includes a stem portion extending from the base portion towards the upper surface of the processing chamber; and
   the stem portion of the baffle is arranged around the stem portion of the collar.

3. The substrate processing system of claim 2, wherein the stem portion of the baffle extends beyond the upper surface of the processing chamber.

4. The substrate processing system of claim 2, wherein flow of purge gas through a gap between a radially outer surface of the showerhead and a side wall of the processing chamber is varied based on a thickness of the baffle and a width of the gap of the baffle to provide a predetermined Peclet number.

5. The substrate processing system of claim 4, wherein a purge gas flow rate, the width of the gap of the baffle and the thickness of the baffle are selected to provide a Peclet number greater than or equal to 5.

6. The substrate processing system of claim 1, wherein the dielectric material is selected from a group consisting of quartz, sapphire, alumina, and aluminum nitride.

7. The substrate processing system of claim 4, wherein the width of the gap of the baffle is less than or equal to 0.2 inches and the thickness of the baffle is less than or equal to than 1 inch.

8. The substrate processing system of claim 1, wherein the gap between the outer edge of the baffle and the sidewalls of the processing chamber is arranged to allow a curtain of air into the processing chamber below the showerhead, and wherein the curtain of air is concentric with the showerhead.

* * * * *